(12) United States Patent
Brandman et al.

(10) Patent No.: US 7,805,663 B2
(45) Date of Patent: Sep. 28, 2010

(54) METHODS OF ADAPTING OPERATION OF NONVOLATILE MEMORY

(75) Inventors: Yigal Brandman, Los Altos Hills, CA (US); Kevin M. Conley, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 970 days.

(21) Appl. No.: 11/536,347

(22) Filed: Sep. 28, 2006

(65) Prior Publication Data

US 2008/0092014 A1 Apr. 17, 2008

(51) Int. Cl.
*H03M 13/03* (2006.01)
(52) U.S. Cl. ........................ 714/794; 714/763
(58) Field of Classification Search ................ 714/763, 714/793, 794
See application file for complete search history.

(56) References Cited

U.S. PATENT DOCUMENTS

| | | | |
|---|---|---|---|
| 5,043,940 A | 8/1991 | Harari | 365/185.03 |
| 5,070,032 A | 12/1991 | Yuan et al. | 438/267 |
| 5,095,344 A | 3/1992 | Harari | 257/328 |
| 5,172,338 A | 12/1992 | Mehrotra et al. | 365/185.03 |
| 5,313,421 A | 5/1994 | Guterman et al. | 365/185.15 |
| 5,315,541 A | 5/1994 | Harari et al. | 365/185.13 |
| 5,343,063 A | 8/1994 | Yuan et al. | 257/317 |
| 5,532,962 A | 7/1996 | Auclair et al. | 365/201 |
| 5,570,315 A | 10/1996 | Tanaka et al. | 365/185.22 |
| 5,657,332 A | 8/1997 | Auclair et al. | 714/763 |
| 5,661,053 A | 8/1997 | Yuan | 438/257 |
| 5,774,397 A | 6/1998 | Endoh et al. | 365/185.19 |
| 5,909,449 A | 6/1999 | So et al. | 714/721 |
| 5,930,167 A | 7/1999 | Lee et al. | 365/185.03 |
| 6,046,935 A | 4/2000 | Takeuchi et al. | 365/185.03 |
| 6,222,762 B1 | 4/2001 | Guterman et al. | 365/185.03 |
| 6,279,133 B1 | 8/2001 | Vafai et al. | |
| 6,298,461 B1 | 10/2001 | Tong et al. | |
| 6,301,151 B1 * | 10/2001 | Engh et al. | 365/185.03 |
| 6,397,364 B1 | 5/2002 | Barkan | 714/746 |
| 6,456,528 B1 | 9/2002 | Chen | 365/185.03 |
| 6,467,062 B1 | 10/2002 | Barkan | 714/764 |
| 6,469,931 B1 | 10/2002 | Ban et al. | 365/185.08 |
| 6,522,580 B2 | 2/2003 | Chen et al. | 365/185.02 |
| 6,674,385 B2 | 1/2004 | Micheloni et al. | 341/155 |

(Continued)

FOREIGN PATENT DOCUMENTS

EP 1137001 A1 9/2001

(Continued)

OTHER PUBLICATIONS

International Search Report mailed Apr. 25, 2008 in International Application No. PCT/US2007/078841.

(Continued)

*Primary Examiner*—Sam Rizk
(74) *Attorney, Agent, or Firm*—Weaver Austin Villeneuve & Sampson LLP

(57) ABSTRACT

In a nonvolatile memory system a Soft-Input Soft-Output (SISO) decoder corrects errors in data that is read from a memory and a statistical unit connected to the SISO decoder collects data regarding corrections. The statistical unit generates at least one output based on the collected data and at least one operating parameter of the memory is modified in response to the output.

15 Claims, 4 Drawing Sheets

U.S. PATENT DOCUMENTS

| | | | |
|---|---|---|---|
| 6,680,986 B1 | 1/2004 | Hemmati | |
| 6,751,766 B2 | 6/2004 | Guterman et al. | 714/736 |
| 6,785,164 B2 | 8/2004 | Gonzalez et al. | 365/185.21 |
| 6,873,549 B2 | 3/2005 | Khalid et al. | 365/185.03 |
| 6,894,926 B2 | 5/2005 | Guterman et al. | 365/185.03 |
| 6,925,007 B2 | 8/2005 | Harari et al. | 365/185.15 |
| 6,941,412 B2 | 9/2005 | Gongwer et al. | 711/103 |
| 6,952,365 B2 | 10/2005 | Gonzalez et al. | 365/185.03 |
| 6,977,844 B2 | 12/2005 | Guterman et al. | 365/185.18 |
| 6,983,428 B2 | 1/2006 | Cernea | 716/1 |
| 6,988,233 B2 | 1/2006 | Kanai et al. | |
| 7,012,835 B2 | 3/2006 | Gonzalez et al. | 365/185.11 |
| 7,035,146 B2 | 4/2006 | Hemink et al. | 365/185.22 |
| 7,039,846 B2 | 5/2006 | Hewitt et al. | |
| 7,088,621 B2 | 8/2006 | Guterman et al. | 365/185.18 |
| 7,092,290 B2 | 8/2006 | Hemink | 365/185.18 |
| 7,139,192 B1 | 11/2006 | Wong | |
| 7,231,580 B2 | 6/2007 | Shiota et al. | |
| 7,249,289 B2* | 7/2007 | Muranaka et al. | 714/48 |
| 7,338,781 B2 | 3/2008 | Golz et al. | |
| 7,388,781 B2 | 6/2008 | Litsyn et al. | |
| 7,424,648 B2 | 9/2008 | Honda | |
| 7,500,167 B2 | 3/2009 | Widdup | |
| 7,607,053 B2 | 10/2009 | Moelker | |
| 2003/0147277 A1* | 8/2003 | Hsu | 365/185.01 |
| 2003/0217323 A1 | 11/2003 | Guterman et al. | |
| 2004/0034827 A1 | 2/2004 | Shen et al. | |
| 2005/0013171 A1 | 1/2005 | Ban et al. | |
| 2005/0157824 A1 | 7/2005 | Kuwazoc et al. | |
| 2005/0204212 A1 | 9/2005 | Noguchi et al. | 714/710 |
| 2005/0213393 A1 | 9/2005 | Lasser | 365/185.33 |
| 2006/0101193 A1 | 5/2006 | Murin | 711/103 |
| 2006/0107127 A1 | 5/2006 | Park et al. | |
| 2006/0114814 A1 | 6/2006 | Kasami et al. | |
| 2007/0086239 A1 | 4/2007 | Litsyn et al. | |
| 2007/0089034 A1 | 4/2007 | Litsyn et al. | |
| 2007/0124652 A1 | 5/2007 | Litsyn et al. | |
| 2007/0150790 A1 | 6/2007 | Gross et al. | 714/763 |
| 2007/0150791 A1 | 6/2007 | Gross et al. | 714/763 |
| 2007/0171714 A1 | 7/2007 | Wu et al. | |
| 2007/0171730 A1* | 7/2007 | Ramamoorthy et al. | 365/185.33 |
| 2007/0208905 A1 | 9/2007 | Litsyn et al. | |
| 2007/0266295 A1 | 11/2007 | Conley | |
| 2007/0266296 A1 | 11/2007 | Conley | |
| 2007/0283227 A1 | 12/2007 | Sharon et al. | |
| 2008/0010581 A1 | 1/2008 | Alrod et al. | |
| 2008/0082897 A1 | 4/2008 | Brandman et al. | |
| 2008/0092015 A1 | 4/2008 | Brandman et al. | |
| 2008/0092026 A1 | 4/2008 | Brandman et al. | |
| 2008/0109702 A1 | 5/2008 | Brandman | |
| 2008/0109703 A1 | 5/2008 | Brandman | |
| 2008/0123419 A1 | 5/2008 | Brandman et al. | |
| 2008/0123420 A1 | 5/2008 | Brandman et al. | |
| 2008/0198650 A1* | 8/2008 | Shalvi et al. | 365/185.02 |

FOREIGN PATENT DOCUMENTS

| | | |
|---|---|---|
| WO | WO00/41507 | 7/2000 |
| WO | WO2007/133963 | 11/2007 |
| WO | WO2008/042593 | 4/2008 |
| WO | WO2008/042598 | 4/2008 |

OTHER PUBLICATIONS

Written Opinion mailed Apr. 25, 2008 in International Application No. PCT/US2007/078841.
U.S. Appl. No. 11/383,401, filed May 15, 2006, Conley.
U.S. Appl. No. 11/383,405, filed May 15, 2006, Conley.
U.S. Appl. No. 11/536,286, filed Sep. 28, 2006, Brandman et al.
U.S. Appl. No. 11/536,327, filed Sep. 28, 2006, Brandman et al.
U.S. Appl. No. 11/536,372, filed Sep. 28, 2006, Brandman et al.
U.S. Appl. No. 11/556,615, filed Nov. 3, 2006, Brandman et al.
U.S. Appl. No. 11/556,626, filed Nov. 3, 2006, Brandman et al.
U.S. Appl. No. 11/556,632, filed Nov. 3, 2006, Brandman.
U.S. Appl. No. 11/556,636, filed Nov. 3, 2006, Brandman.
"Noisy Channel Coding Theorem", Wikipedia, http://en.wikipedia.org/wiki/Shannon%27s_theorem, downloaded Mar. 23, 2006, 3 pages.
"Convolutional Code", Wikipedia, http://en.wikipedia.org/wiki/Convolutional_code, downloaded Mar. 23, 2006, 2 pages.
"Turbo Code", Wikipedia, http://en.wikipedia.org/wiki/Turbo_code, downloaded Mar. 23, 2006, 4 pages.
Chip Fleming, "A Tutorial on Convolutional Coding with Viterbi Decoding," http://home.netcom.com/~chip.f/viterbi/tutorial.html, dated Jan. 31, 2003, downloaded Mar. 23, 2006, 5 pages.
"Error Correcting Codes", http://www.dcs.ed.ac.uk/home/stg/pub/E/ecc.html, downloaded Mar. 18, 2005, 2 pages.
Bernard Sklar, "Fundamentals of Turbo Codes," Prentice Hall, Mar. 15, 2002, 30 pages.
R.Y.S. Tee et al., "Generalized Low-Density Parity-Check Coding Aided Multilevel Codes," IEEE, 2006, 5 pages.
EP Examination Report mailed Oct. 9, 2009 in Application No. 07814918.4.
U.S. Office Action mailed Jan. 28, 2010 in U.S. Appl. No. 11/536,372.
U.S. Appl. No. 11/536,347, filed Sep. 28, 2006, Brandman et al.
International Searching Authority Search Report mailed Mar. 17, 2008 in International Application No. PCT/US2007/078819.
Written Opinion of the International Searching Authority mailed Mar. 17, 2008 in International Application No. PCT/US2007/078819.
U.S. Office Action dated Feb. 19, 2010 in U.S. Appl. No. 11/536,286.
U.S. Office Action dated Jan. 6, 2010 in U.S. Appl. No. 11/536,327.

* cited by examiner

METHODS OF ADAPTING OPERATION OF NONVOLATILE MEMORY

CROSS-REFERENCE TO RELATED APPLICATIONS

This application is related to U.S. patent application Ser. No. 11/536,286, filed Sep. 28, 2006, entitled, "Methods of Soft-Input Soft-Output Decoding for Nonvolatile Memory"; and to U.S. patent application Ser. No. 11/536,327, filed Sep. 28, 2006, entitled "Soft-Input Soft-Output Decoder for Nonvolatile Memory"; and to U.S. patent application Ser. No. 11/536,372, filed Sep. 28, 2006, entitled "Nonvolatile Memory with Adaptive Operation", all of which are filed on the same day as the present application. These applications are incorporated in their entirety by reference as if fully set forth herein.

BACKGROUND OF THE INVENTION

This invention relates to nonvolatile memory systems and to methods of operating nonvolatile memory systems.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Data stored in a nonvolatile memory system may contain erroneous bits when data is read. Traditional ways to reconstruct corrupted data include the application of Error Correction Codes (ECCs). Simple Error Correction Codes encode data by storing additional parity bits, which set the parity of groups of bits to a required logical value, when the data is written into the memory system. If during storage the data is erroneous, the parity of groups of bits may change. Upon reading the data from the memory system, the parity of the group of the bits is computed once again by the ECC. Because of the data corruption the computed parity may not match the required parity condition, and the ECC may detect the corruption.

ECCs can have at least two functions: error detection and error correction. Capability for each of these functions is typically measured in the number of bits that can be detected as erroneous and subsequently corrected. Detection capability can be the same or greater than the correction capability. A typical ECC can detect a higher number of error bits than it can correct. A collection of data bits and parity bits is sometimes called a word An early example is the (7,4) Hamming code, which has the capability of detecting up to two errors per word (seven bits in this example) and has the capability of correcting one error in the seven-bit word.

More sophisticated ECCs can correct more than a single error per word, but it becomes computationally increasingly complex to reconstruct the data. Common practice is to recover the data with some acceptably small likelihood of incorrect recovery. However with increasing number of errors the probability of reliable data recovery also decreases rapidly or the associated costs in additional hardware and/or performance become prohibitively high.

In semiconductor memory devices, including EEPROM systems, data can be represented by the threshold voltages of transistors. Typically, different digital data storage values correspond to different voltage ranges. If, for some reason, during the read operation the voltage levels shift from their preferred ranges, an error occurs. The error may be detected by the ECC and in some cases these errors may be corrected.

SUMMARY OF INVENTION

In a nonvolatile memory system, a statistical unit collects statistical information regarding decoding of data from a nonvolatile memory array by a decoder that provides likelihood values as its output. In response to the statistical information, at least one operating parameter of the memory array is changed.

In one example, a parameter that is changed is associated with writing data to the memory array. In particular, the difference between successive voltage pulses that are used to program data to the memory array may be changed according to the statistical information.

In another example, a parameter that is changed is associated with reading data from the memory array. In particular, a resolution used to read data from the nonvolatile memory array may be changed according to the statistical information.

DETAILED DESCRIPTION OF ILLUSTRATED EMBODIMENTS

Figure 1:
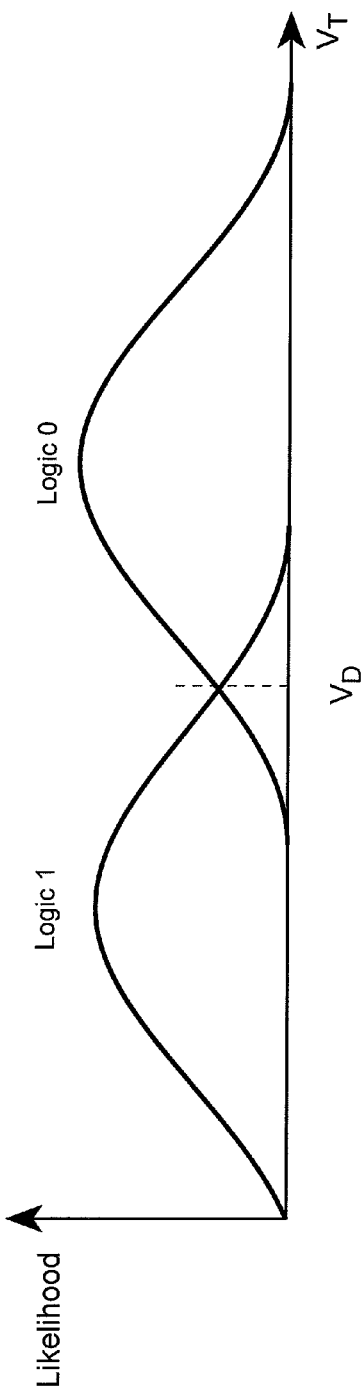
FIG. 1 shows likelihood functions of threshold voltages of cells programmed to a logic 1 state and a logic 0 state in a nonvolatile memory, including a voltage $V_D$ used to discriminate logic 1 and logic 0 states.

In many nonvolatile memories, data read from a memory array may have errors. That is, individual bits of input data that are programmed to a memory array may later be read as being in a different logical value. FIG. 1 shows the relationship between a physical parameter indicating a memory cell state (threshold voltage, $V_T$) and the logical values to which the memory cell may be programmed. In this example, only two states are stored in the cell. Thus, the cell stores one bit of data. Cells programmed to the logic 0 state generally have a higher threshold voltage than cells in the logic 1 (unprogrammed) state. In an alternative scheme, the logic 1 state is the unprogrammed state of the memory cell. The vertical axis of FIG. 1 indicates the likelihood of reading a cell at any particular threshold voltage based upon expected threshold voltage distribution. A first likelihood function is shown for cells programmed to logic 1 and a second for cells programmed to logic 0. However, these functions have some degree of overlap between them. A discrimination voltage $V_D$ is used in reading such cells. Cells having a threshold voltage below $V_D$ are considered to be in state 1, while those having a threshold voltage above $V_D$ are considered to be in state 0. As FIG. 1 shows, this may not always be correct. Because of the overlap between functions, there is a non-zero likelihood that a memory cell programmed to a logic 1 state will be read as having a threshold voltage greater than $V_D$ and so will be read as being in a logic 0 state. Similarly, there is a non-zero likelihood that a memory cell programmed to a logic 0 state will be read as having a logic 1 state.

Overlap between functions occurs for a number of reasons including physical defects in the memory array and disturbance caused to programmed cells by later programming or reading operations in the memory array. Overlap may also occur due to a general lack of ability to keep a large number of cells within a very tight threshold voltage range. Certain programming techniques may allow functions of threshold voltages to be narrowed (have smaller standard deviations). However, such programming may take more time. In some memory systems, more than one bit is stored in a memory cell. In general, it is desirable to store as many bits as possible in a memory cell. In order to efficiently use the available threshold voltage range, functions for adjacent states may be such that they significantly overlap.

Nonvolatile memory systems commonly employ ECC methods to overcome errors that occur in data that is read from a memory array. Such methods generally calculate some additional ECC bits from input data to be stored in a memory array according to an encoding system. Other ECC schemes may map input data to output data in a more complex way. The ECC bits are generally stored along with the input data but may be stored separately. The input data and ECC bits are later read from the nonvolatile memory array together and a decoder uses both the data and ECC bits to check if any errors are present. In some cases, such ECC bits may also be used to identify a bit that is in error. The erroneous bit is then corrected by changing its state (changed from a "0" to a "1" or from a "1" to a "0"). Appending ECC bits to data bits is not the only way to encode data before storing it in a nonvolatile memory. For example, data bits may be encoded according to a scheme that provides the following transformations: 00 to 1111, 01 to 1100, 10 to 0011 and 11 to 0000.

Figure 2:
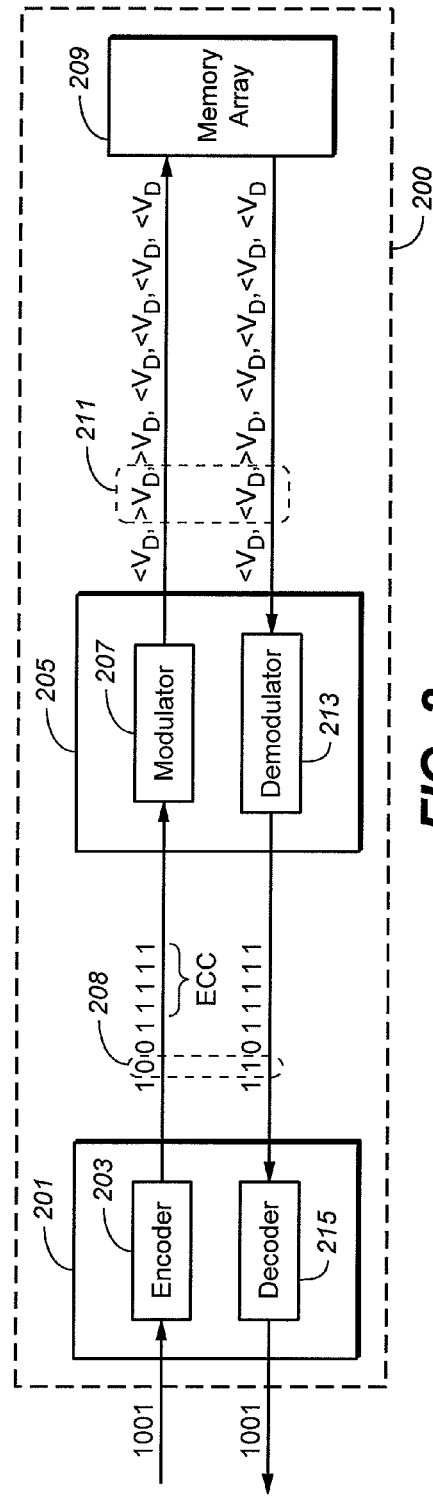
FIG. 2 shows components of a memory system including a memory array, modulator/demodulator circuits and encoder/decoder circuits.

FIG. 2 shows an example of input data being stored in a memory system 200. Input data is first received by an ECC unit 201 that includes an encoder 203. The input data may be host data to be stored in memory system 200 or may be data generated by a memory controller. The example of FIG. 2 shows four input data bits 1001. Encoder 203 then calculates ECC bits (1111) from the input data bits using an encoding scheme. One example of an encoding scheme is to generate ECC bits that are parity bits for selected groups of data bits.

Both the input data bits and the ECC bits are then sent to a modulation/demodulation unit 205 that includes a modulator 207. Modulator 207 converts the digital data sent by ECC unit 201 to a form in which it is written in a memory array 209. In one scheme, the digital data is converted to a plurality of threshold voltage values in a plurality of memory cells. Thus, various circuits used to convert digital data to a stored threshold voltage in a memory cell may be considered to form a modulator. In the example of FIG. 2, each memory cell may hold one bit of data. Thus, each memory cell may have a threshold voltage in one of two ranges, one signifying a logic "1" state and the other signifying a logic "0" state as shown in FIG. 1. The memory cells storing a logic "1" state have a threshold voltage that is less than $V_D$ ($<V_D$) while the memory cells storing a logic "0" state have a threshold voltage that is greater than $V_D$ ($>V_D$). Cells may be programmed and verified to a nominal threshold voltage higher than $V_D$ to ensure that, at least initially, there is some preferred separation between cells programmed to the two logic states.

Data may be stored in memory array 209 for some period of time. During this time, various events may occur to cause threshold voltages of memory cells to change. In particular, operations involving programming and reading may require voltages to be applied to word lines and bit lines in a manner that affects other previously programmed cells. Such disturbs are particularly common where dimensions of devices are reduced so that the interaction between adjacent cells is significant. Charge may also be lost over long periods of time. Such data retention failures can also cause data to change when read. As a result of such changes, data bits may be read out having different states than the data bits originally programmed. In the example of FIG. 2, one input data bit 211 is read as having a threshold value less than $V_D$ ($<V_D$) when it was originally written having a threshold value greater than $V_D$ ($>V_D$).

The threshold voltages of memory cells are converted to bits of data by a demodulator 213 in modulation/demodulation unit 205. This is the reverse of the process performed by the modulator. Demodulator 213 may include sense amplifiers that read a voltage or current from a memory cell in memory array 209 and derive the state of the cell from the reading. In the example of FIG. 2, a memory cell having a threshold voltage less than $V_D$ ($<V_D$) gives a demodulated output of "1" and a memory cell having a threshold voltage that is greater than $V_D$ ($>V_D$) gives a demodulated output of "0." This gives the output sequence 11011111 shown. The second bit 208 of this sequence is in error as a result of being stored in the memory array 209.

The output of demodulator 213 is sent to a decoder 215 in ECC unit 201. Decoder 215 determines from data bits and ECC bits if there are any errors. If a small number of errors is present that is within the correction capability of the code, the errors are corrected. If large numbers of errors are present, they may be identified but not corrected if they are within the detection capability of the code. If the number of errors exceeds the detection capability of the code, the errors may not be detected, or may result in an erroneous correction. In the example of FIG. 2, the error in the second bit is detected and is corrected. This provides an output (1001) from decoder 215 that is identical to the input sequence. The decoding of memory system 200 is considered to be hard-input hard-output decoding because decoder 215 receives only data bits representing input data bits and ECC bits, and decoder 215 outputs a corrected sequence of data bits corresponding to input data bits (or fails to give an output if the number of errors is too high).

Figure 3:
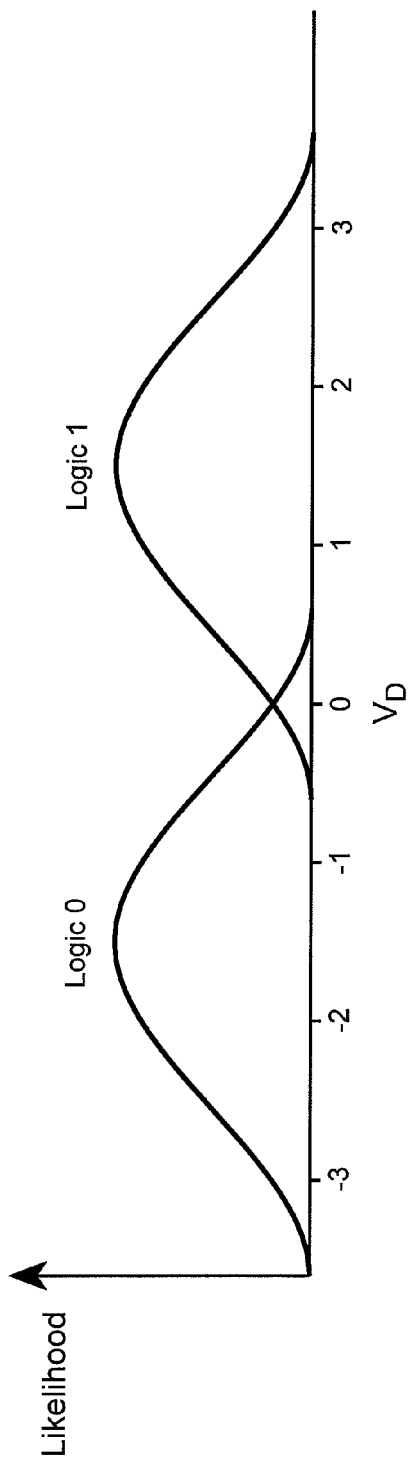
FIG. 3 shows likelihood function of read threshold voltages of cells programmed to a logic 1 state and a logic 0 state, showing threshold voltage values.
Figure 4:
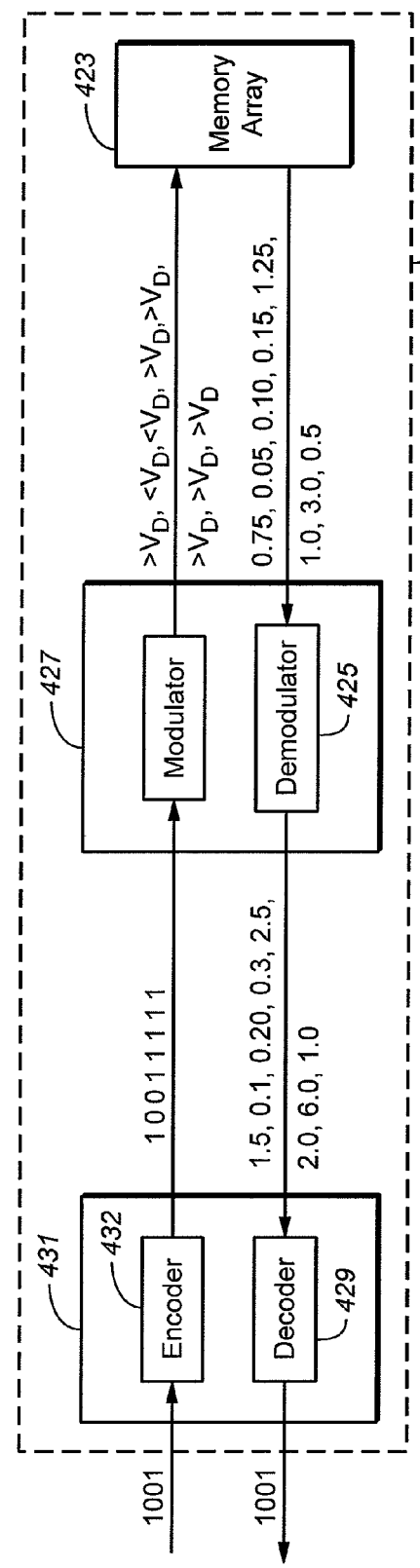
FIG. 4 shows components of a memory system including a memory array, modulator/demodulator circuits and encoder/decoder circuits, a demodulator providing likelihood values to a decoder.

An alternative memory system to memory system 200 is shown in FIGS. 3 and 4. FIG. 3 shows similar functions to those of FIG. 1 with $V_D=0$ and with threshold voltages below $V_D$ representing logic 0 and voltages above $V_D$ representing logic 1. Instead of showing a single voltage $V_D$ dividing threshold voltages into two different ranges, here the threshold voltages are indicated by actual voltage numbers. The function corresponding to logic "1" is centered above 0 volts and the function corresponding to logic "0" is centered below 0 volts.

FIG. 4 shows a memory system 421 using a data storage process that is similar to that of memory system 200 (using the same input data bits and ECC bits) with a different read process. In particular, instead of simply determining whether a threshold voltage is above or below a particular value, memory system 421 reads threshold voltages as shown in FIG. 3. It will be understood that actual threshold voltage is not necessarily read. Other means of cell operation may be used to store and retrieve data (e.g. current sensing). Voltage sensing is merely used as an example. Generally, threshold voltage refers to a gate voltage at which a transistor turns on. FIG. 4 shows a read occurring that provides more detailed information than the previous example. This may be considered a read with a higher resolution than that of FIG. 2 (and a resolution that resolves more states than are used for programming). As in the previous example, errors occur in the read data. Here, the readings corresponding to the second and third bits are in error. The second and third bits were logic "0" and were stored by programming a cell to have a threshold voltage less than $V_D$ but the cells are read as having threshold voltages of 0.05 volts and 0.10 volts which is higher than $V_D$ ($V_D=0$ volts).

The raw voltages read from memory array 423 of FIG. 4 by a series of read operations are sent to a demodulator 425 in a modulation/demodulation unit 427. The raw voltages have a finite resolution dictated by the resolution of the Analog-to-Digital conversion. Here, raw data is converted into likelihood data. In particular, each cell reading is converted into a likelihood that the corresponding bit is a one or a zero. The series of readings from the memory array (0.75, 0.05, 0.10, 0.15, 1.25, 1.0, 3.0, and 0.5 volts) can indicate not only the state of the cell, but can also be used to provide a degree of certainty as to that state. This may be expressed as a likelihood that a memory cell was programmed with a particular bit. Thus, readings that are close to 0 volts may give low likelihood values, while readings that are farther from 0 volts give higher likelihood values. The likelihood values shown are log likelihood ratios (explained in detail below). This provides negative numbers for cells in a logic 0 state and positive numbers for cells in a logic 1 state, with the magnitude of the number indicating the likelihood that the state is correctly identified. The second and third likelihood values (0.1, 0.2) indicate logic "1". The second and third values indicate likelihoods that are quite low.

Likelihood values are sent to a decoder 429 in an ECC unit 431 (in some cases, obtaining likelihood values from raw values may be considered as being performed in the decoder). ECC unit 431 also includes encoder 432. The decoder 429 performs decoding operations on likelihood values. Such a decoder may be considered a soft-input decoder. In general, soft-input refers to an input that includes some quality information related to data that are to be decoded. The additional information provided as a soft-input generally allows a decoder to obtain better results. A decoder may perform decoding calculations using a soft-input to provide calculated likelihood values as an output. This is considered a soft-output and such a decoder is considered a Soft-Input Soft-Output (SISO) decoder. This output can then be used again as input to the SISO decoder to iterate the decoding and improve results. A SISO decoder may form part of a larger decoder that provides a hard output to another unit. SISO decoders generally provide good performance and in some cases may provide better performance than is possible with hard-input hard-output decoding. In particular, for the same amount of overhead (number of ECC bits) a SISO decoder may provide greater error correction capability. In order to efficiently use a SISO decoder, a suitable encoding/decoding scheme may be implemented and demodulation is adapted to efficiently obtain a soft-input without excessive complexity and without requiring excessive time for reading data from the memory array.

In one embodiment, a soft-input for a SISO decoder is provided by reading data in a nonvolatile memory array with a resolution that resolves a larger number of states than were used in programming the memory. Thus, data may be written by programming a memory cell to one of two threshold voltage ranges and subsequently read by resolving three or more threshold voltage ranges. Typically, the number of threshold voltage ranges used in reading will be some multiple of the number of threshold voltage ranges used in programming (for example, twice as many). However, this is not always the case.

An ECC unit may be formed as a dedicated circuit or this function may be performed by firmware in a controller. Typically, a controller is an Application Specific Integrated Circuit (ASIC) that has circuits designed for specific functions such as ECC and also has firmware to manage controller operations. Thus, an encoder/decoder may be formed by a combination of hardware and firmware in the memory controller. An encoder/decoder (ECC unit) may alternatively be located on the memory chip. The modulation/demodulation unit may be on a memory chip, on a controller chip, on a separate chip or some combination. Generally, a modulation/demodulation unit will include at least some components on the memory chip (such as peripheral circuits connected to a memory array). While FIG. 4 indicates threshold voltages being read to a high resolution (an analog read), the degree of resolution chosen may depend on a number of factors including the type of nonvolatile memory used.

Figure 5:
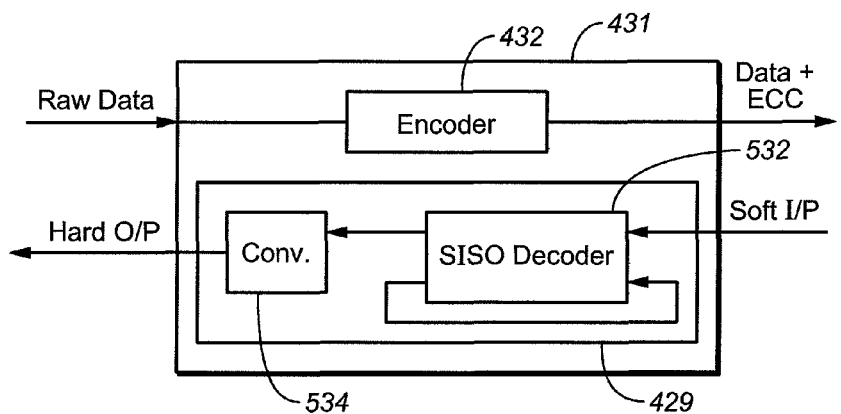
FIG. 5 shows an ECC unit having a Soft-Input Soft-Output (SISO) decoder.

FIG. 5 shows a more detailed view of ECC unit 431, particularly decoder 429. Decoder 429 includes a SISO decoder 532 and a soft-hard converter 534. SISO decoders generally accept raw likelihood data and perform ECC calculations on the raw likelihood data to provide calculated likelihood data. The calculated likelihood data may be considered a soft-output. In many cases, such a soft-output is then provided as an input to the SISO decoder so that a second decoding iteration is performed. A SISO decoder may perform successive iterations until at least one predetermined condition is achieved. For example, a predetermined condition may be that all bits have a likelihood that is greater than a certain minimum value. A predetermined condition could also be an aggregate of likelihood values such as a mean likelihood value. A predetermined condition may be convergence of results from one iteration to the next (i.e. keep iterating until there is little improvement from additional iterations). A predetermined condition may be that a predetermined number of iterations are completed. Combinations of these conditions may also be used. Decoding is performed using an encoded pattern in the data that is the result of encoding performed by encoder 432 on the data before it was stored. Encoder 432 and decoder 429 are both considered parts of ECC unit 431.

Efficient decoding depends on having a suitable encoding/decoding scheme. Various schemes are known for encoding data in a manner that is suitable for subsequent decoding in a SISO decoder such as SISO decoder 532. Encoding/decoding schemes include, but are not limited to, turbo codes, product codes, BCH codes, Reed-Solomon codes, convolutional codes (see U.S. patent application Ser. Nos. 11/383,401 and 11/383,405), Hamming codes, and Low Density Parity Check (LDPC) codes. A detailed description of LDPC codes and turbo codes and how they may be used with SISO decoding is provided in U.S. patent application Ser. Nos. 11/536,327 and 11/536,286, entitled "Soft-input soft-output decoder for nonvolatile memory" and "Methods of soft-input soft-output decoding for nonvolatile memory," filed on or around the same date as the present application.

Figure 6:
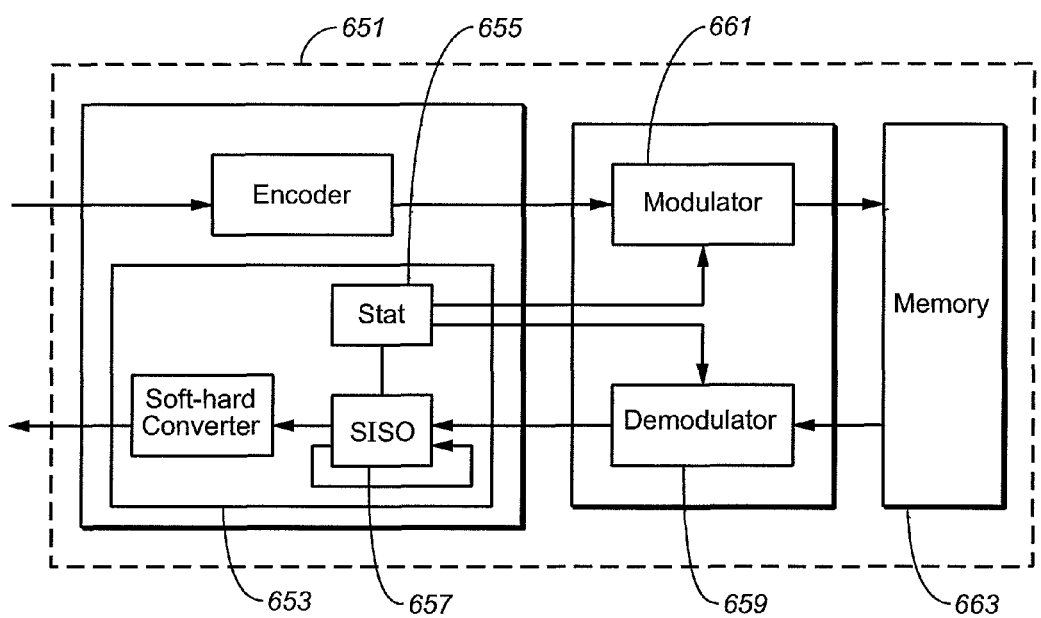
FIG. 6 shows a memory system including a SISO decoder with a statistical unit that provides a signal to a modulator and to a demodulator.

FIG. 6 shows a memory system 651 according to an embodiment of the present invention that includes a decoder 653 having a statistical unit 655 connected to a SISO decoder 657. The statistical unit 655 receives data from the SISO decoder 657 regarding decoding operations carried out by the SISO decoder 657. In particular, the statistical unit 655 may collect statistical data on the operations carried out by the SISO decoder 657 in order to obtain one or more statistical indicators of the quality of data being received by the SISO decoder 657 from the demodulator 659. One measure of the quality of data is the Signal to Noise Ratio (SNR) of the data. A SNR or other quality measure may be obtained over some period of time for all data decoded by the SISO decoder. Alternatively, separate quality indicators may be calculated for different portions of the memory array. A quality indicator may be obtained over a large amount of data so that a statistically sufficient population is used. A quality indicator may be obtained from the average number of iterations needed to achieve a predetermined condition in an iterative decoding scheme. A quality indicator may be obtained from the rate at which corrections are required, the average hamming distance of corrections, the types of corrections performed or some other statistic regarding decoding by the SISO decoder.

In general, a particular decoder is able to decode data having a range of SNRs up to some maximum SNR. It is possible in some memory systems to change operating parameters in ways that affect the SNR of a soft-input. However, providing a better (higher) SNR may require more complexity or more time or both complexity and time. Thus, there is generally a tradeoff between obtaining a good SNR versus incurring additional time and complexity in operating the memory system. Where a decoder can reliably correct data above some minimum SNR, it may be efficient to operate the memory system in a manner that provides a SNR that is close to the minimum. A particular SNR (or SNR range) may be selected as a target SNR (target range) for input to a decoder.

Typically, the SNR of data from a memory deteriorates with use. Thus, a memory may provide data with a high SNR initially and later provide data with a low SNR. In one example, operating parameters are adjusted to maintain the SNR at a target value, or within a target range. When a memory system is new and tends to have a high SNR, operating parameters may be set at appropriate levels to maintain a target SNR, or SNR range. Later, after some use, the memory tends to output data having a lower SNR and operating parameters may be set at appropriate levels to compensate for the drop in SNR caused by use. Thus, the SNR is maintained at the target SNR, or within the target SNR range. Alternatively, it may by convenient to compensate for a drop in SNR in input data to the decoder by changing an operating parameter that affects the decoder's performance. Such adjustment of operating parameters of a memory array may be based on an SNR value or other quality indicator obtained from SISO decoding. FIG. 6 shows the statistical unit 655 providing feedback signal to the modulator 661 and the demodulator 659. Other signals may also be provided by the statistical unit 655. In particular examples, programming and reading operations are changed according to signals from the statistical unit. In other examples, other operating parameters may be changed.

Figure 7:
FIG. 7 shows a series of pulses of increasing voltage that are used to program a cell in a nonvolatile memory, the differences in voltage between pulses modified according to a signal from the statistical unit.

One example of an operating parameter of a memory array that may be changed is the pulse height of a voltage pulse used to program a memory cell. In one programming scheme, a memory cell is programmed by applying a series of increasing voltage pulses to the control gate of the memory cell until the memory cell is verified as having reached some target threshold voltage. FIG. 7 shows an example of a series of programming voltage pulses used to program a memory cell. Between each voltage pulse a verify operation is performed to verify if the memory cell has reached a predetermined threshold voltage. Successive programming voltage pulses increase by an increment $\Delta V$. The size of this increment may affect the quality of data read from the memory array. In general, if $\Delta V$ is small, then the threshold voltage distributions for individual logic states will be narrow (small standard deviation) so that misreading of data is reduced. However, if $\Delta V$ is small then the number of pulses, and therefore the time, needed to program a memory cell to a particular threshold voltage is increased. In one embodiment, the size of the increment $\Delta V$ is chosen in response to a quality indication from the statistical unit. In particular, if the statistical unit indicates that a SNR is higher than a target, then $\Delta V$ may be increased in size, thus reducing the SNR of the data read from the memory array. If the statistical unit indicates that the SNR is lower than a target, then $\Delta V$ may be reduced in size thus reducing the SNR of the data read from the memory array.

The size of $\Delta V$ may initially be set to a predetermined value that is relatively large because the SNR of the memory system tends to be high initially. As the memory is used, the SNR of data read from the array tends to drop. This drop is detected by the statistical unit 655 and in response the size of $\Delta V$ is reduced. Thus, the statistical unit 655 provides a feedback signal to a programming circuit in the modulator 661 that performs operations on the memory array 663, and the programming circuit changes at least one operating parameter of the memory array 663 in response to the feedback signal. Other operating parameters associated with programming may be modified in response to a signal from the statistical unit 655.

Figure 8:
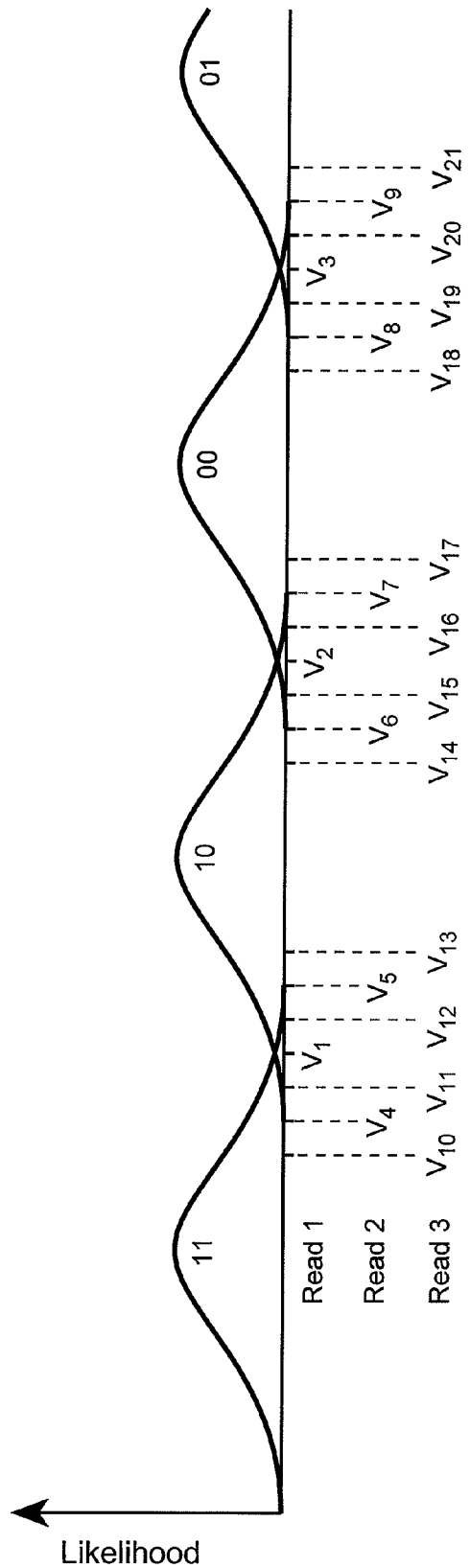
FIG. 8 shows likelihood distributions of read threshold voltages of cells programmed to four logical states and shows threshold voltages where cells are read in successive read operations, the number of read operations modified according to a signal from the statistical unit.

Another example of an operating parameter that may be changed is the resolution of a read operation. FIG. 8 shows an example where memory cells are programmed to one of four states. Three successive reads are performed, a first read resolving four threshold voltage ranges corresponding to the four programmed states, the second read further resolving threshold voltage range of the first read into three ranges and a third read further resolving these ranges. Each of these reads adds to the time needed to output data from the memory system. More reads generally provide a higher resolution that gives the SISO decoder more information and allows the SISO decoder to better correct data. However, high resolution reading takes more time. For example, a single read to distinguish two states may require 25 microseconds to complete, where three reads to distinguish four states may require 75 microseconds. In one example, the number of reads performed is determined by a signal from the statistical unit 655. Thus, if the statistical unit 655 indicates a high SNR, then the number of reads may be reduced, saving time. If the statistical unit 655 indicates a low SNR, then the number of reads may be increased, increasing the information available to the SISO decoder and thus compensating for the low SNR. In other memories, other reading systems are used that do not show a read pattern like that of FIG. 8. Generally, in such memories higher resolution requires more time or more complexity. So, reducing resolution will generally allow faster, or simpler, or both faster and simpler reading.

In one example, the read resolution is initially set to a predetermined level. As statistical information is gathered by the statistical unit, this number may be changed. For example, the SNR of data output from the memory array may drop as the memory is used and, to compensate, the read resolution may be increased. Thus, the statistical unit provides a feedback signal and an operating parameter of the memory array is changed in response to the feedback signal. Other operating parameters of the memory array 663 associated with reading or writing may also be changed in response to a signal from the statistical unit 655.

The reading scheme of FIG. 8 may be used with a NAND flash memory. This is a type of memory that uses strings of memory cells connected together in series. Various NAND flash memory designs and methods of operating NAND flash memories are described in U.S. Pat. Nos. 7,088,621; 7,092,290 and 6,983,428.

In some cases, an ECC unit may use more than one encoder and more than one decoder to provide concatenated encoding and decoding. A statistical unit may be provided that collects statistical information from one or more decoders in such an arrangement. Alternatively, separate statistical units may be provided for different decoders with each statistical unit providing one or more separate outputs.

A signal from a statistical unit may be provided to any circuit in the memory system that affects an operating parameter of the memory array. This includes circuits within the modulator, demodulator, memory array, ECC unit, or any circuit in a memory controller. More than one signal may be generated by a statistical unit to control more than one operating parameter. For example, both programming pulse voltage and read resolution may be changed in response to a signal provided by a statistical unit, or they may be changed in response to separate signals that may be based on the same or different statistical information.

In some cases, a statistical unit is formed as part of a controller ASIC. The statistical unit may be formed by dedicated circuits, by firmware in the controller or by a combination of dedicated circuits and firmware. Alternatively, a statistical unit may be formed separately from the controller, on a dedicated chip, or otherwise.

The various examples above refer to flash memory. However, various other nonvolatile memories are currently in use and the techniques described here may be applied to any suitable nonvolatile memory systems. Such memory systems may include, but are not limited to, memory systems based on ferroelectric storage (FRAM or FeRAM), memory systems based on magnetoresistive storage (MRAM), and memories based on phase change (PRAM or "OUM" for "Ovonic Unified Memory").

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A method of managing data in a nonvolatile memory array comprising:
   reading stored data from the nonvolatile memory array;
   deriving raw probability information from the stored data;
   providing the raw probability information to a decoder, the decoder calculating output probability information from the raw probability information and from an encoded pattern in the stored data;
   calculating quality information for the stored data, the quality information reflecting the amount of correction performed by the decoder; and
   changing at least one operating parameter of the nonvolatile memory array in response to the quality information.

2. The method of claim 1 wherein the quality information is stored and is statistically analyzed with quality information for other stored data, the at least one operating parameter changed in response to the statistical analysis.

3. The method of claim 1 wherein the output probability information is provided as an input to the decoder so that the decoder performs at least two iterations of calculating output probability information for the stored data.

4. The method of claim 3 wherein repeated iterations of calculating output probability information are performed until a predetermined condition is met.

5. The method of claim 4 wherein the quality information is derived from the number of iterations performed before the predetermined condition is met.

6. The method of claim 4 wherein the quality information is derived from the number of corrections performed before the predetermined condition is met.

7. The method of claim 4 wherein the quality information is derived from the type of corrections performed by the decoder.

8. The method of claim 1 wherein the at least one operating parameter affects a sequence of voltage pulses used to program a memory cell of the memory array.

9. The method of claim 1 wherein the at least one operating parameter includes a resolution used to read data stored in a memory cell of the memory array.

10. A nonvolatile memory system comprising:
   an encoder configured to encode data according to an encoding scheme;
   a nonvolatile memory array for storing the encoded data;
   a decoder configured to receive raw probability information derived from the encoded data from the memory array and to decode such encoded data from the nonvolatile memory array by performing two or more decoding iterations, the output data of a particular iteration provided as input data to a subsequent iteration, wherein the output data includes output probability information that is based on the raw probability information; and a statistical unit that derives at least one measure of data quality of the encoded data from the decoding and provides an output to at least one circuit that controls operation of the memory array based on such measure of data quality.

11. The nonvolatile memory system of claim 10 further comprising a writing circuit that writes the encoded data to the memory array, the output provided to the writing circuit.

12. The nonvolatile memory system of claim 10 further comprising a reading circuit that reads the encoded data from the memory array, the output provided to the reading circuit.

13. The nonvolatile memory system of claim 10 wherein the decoder is further configured to perform repeated iterations of calculating output probability until a predetermined output probability information or a predetermined data quality is met.

14. The nonvolatile memory system of claim 13 wherein the statistical unit is configured to provide output to at least one circuit to control a sequence of voltage pulses used to program a memory cell of the memory array based on the measure of data quality.

15. The nonvolatile memory system of claim 13 wherein the statistical unit is configured to provide output to at least one circuit to control a resolution used by the decoder to read data stored in a memory cell of the memory array based on the measure of data quality.

* * * * *